United States Patent
Kwon et al.

(10) Patent No.: US 10,490,763 B2
(45) Date of Patent: Nov. 26, 2019

(54) DISPLAY DEVICE AND MANUFACTURING METHOD THEREOF

(71) Applicant: ELECTRONICS AND TELECOMMUNICATIONS RESEARCH INSTITUTE, Daejeon (KR)

(72) Inventors: Byoung-Hwa Kwon, Daejeon (KR); Chul Woong Joo, Daejeon (KR); Jonghee Lee, Daejeon (KR); Hyunkoo Lee, Daejeon (KR); Hyunsu Cho, Cheongju (KR); Nam Sung Cho, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 3 days.

(21) Appl. No.: 16/053,333

(22) Filed: Aug. 2, 2018

(65) Prior Publication Data

US 2019/0131559 A1 May 2, 2019

(30) Foreign Application Priority Data

Oct. 26, 2017 (KR) ........................ 10-2017-0140493

(51) Int. Cl.
*H01L 51/50* (2006.01)
*H01L 51/00* (2006.01)
*H01L 51/56* (2006.01)

(52) U.S. Cl.
CPC ........ *H01L 51/5032* (2013.01); *H01L 51/002* (2013.01); *H01L 51/0003* (2013.01);
(Continued)

(58) Field of Classification Search
CPC .............. H01L 51/002; H01L 51/0003; H01L 51/5032; H01L 51/0026; H01L 51/56; H01L 2251/303; H01L 2251/554
See application file for complete search history.

(56) References Cited

U.S. PATENT DOCUMENTS

| 8,213,154 B2 | 7/2012 | Sullivan et al. |
| 9,053,937 B2 | 6/2015 | Park et al. |
| (Continued) | | |

FOREIGN PATENT DOCUMENTS

| KR | 10-0710003 B1 | 4/2007 |
| KR | 10-2014-0068026 A | 6/2014 |
| (Continued) | | |

OTHER PUBLICATIONS

Jong H. Kim et al., "High-Performance and Environmentally Stable Planar Heterojunction Perovskite Solar Cells Based on a Solution-Processed Copper-Doped Nickel Oxide Hole-Transporting Layer", Advanced Materials, 2014, pp. 1-7, Wiley-VCH Verlag GmbH & Co. KGaA.

*Primary Examiner* — Thanh Y. Tran

(57) ABSTRACT

Provided is a display device and a manufacturing method thereof. More specifically, the present invention relates to a display device including a nickel oxide thin film co-doped with a copper monovalent cation and a copper divalent cation, and a manufacturing method thereof. The present invention provides a display device including a substrate, a first electrode layer disposed on the substrate, a first common layer disposed on the substrate, a light emitting layer disposed on the first common layer, a second common layer disposed on the light emitting layer, and a second electrode layer disposed on the second common layer, wherein the first common layer includes a nickel oxide thin film co-doped with a first metal cation and a second metal cation, and the
(Continued)

oxidation number of the first metal cation and the oxidation number the second metal cation are different from each other.

11 Claims, 13 Drawing Sheets

(52) U.S. Cl.
CPC ...... H01L 51/0026 (2013.01); H01L 51/5088 (2013.01); H01L 51/56 (2013.01); *H01L 2251/303* (2013.01); *H01L 2251/554* (2013.01)

(56) References Cited

U.S. PATENT DOCUMENTS

| | | | |
|---|---|---|---|
| 2012/0326190 A1* | 12/2012 | Kim | H01L 51/5218 257/98 |
| 2014/0175440 A1* | 6/2014 | Mohammed | H01L 33/16 257/52 |
| 2015/0236169 A1 | 8/2015 | Park et al. | |

FOREIGN PATENT DOCUMENTS

| | | |
|---|---|---|
| KR | 10-2016-0127866 A | 11/2016 |
| WO | 2013013135 A1 | 1/2013 |

* cited by examiner

DISPLAY DEVICE AND MANUFACTURING METHOD THEREOF

CROSS-REFERENCE TO RELATED APPLICATIONS

This U.S. non-provisional patent application claims priority under 35 U.S.C. § 119 of Korean Patent Application No. 10-2017-0140493, filed on Oct. 26, 2017, the entire contents of which are hereby incorporated by reference.

BACKGROUND

The present disclosure herein relates to a display device, and a manufacturing method thereof. More specifically, the present invention relates to a display device including a nickel oxide thin film co-doped with a copper monovalent cation and a copper divalent cation, and a manufacturing method thereof.

As a typical method for increasing electrical conductivity of an oxide thin film, a method for increasing carrier concentration of a material itself through doping is known. The carrier concentration of an oxide thin film may be increased due to the difference between the oxidation number of a metal cation of the oxide thin film and the oxidation number of a dopant ion, the vacancy inside a lattice structure which is deformed by a dopant, an interstitial element, a substitution element, and the like.

The dopant may be variously configured depending on the principle of doping and a metal element of the oxide thin film. In general, a single element or different elements may be used as a dopant.

In a solution process, a precursor material or a solution for a dopant is mixed with an oxide solution or a precursor solution to form a thin film, and then the doping may be completed by activating the dopant through a heat treatment or by distributing the dopant in the oxide thin film.

SUMMARY

The present disclosure provides a display device having excellent electrical conductivity, high ionization energy, and excellent current density and luminance properties.

An embodiment of the inventive concept provides a display device including a substrate, a first electrode layer disposed on the substrate, a first common layer disposed on the substrate, a light emitting layer disposed on the first common layer, a second common layer disposed on the light emitting layer, and a second electrode layer disposed on the second common layer, wherein the first common layer includes a nickel oxide thin film co-doped with a first metal cation and a second metal cation, and the oxidation number of the first metal cation and the oxidation number the second metal cation are different from each other.

In an embodiment, the nickel oxide thin film may have a peak ratio of 3.5 to 4.0 according to the result of narrow scan of Ni2p electron orbit using X-ray photoelectron spectroscopy.

In an embodiment, the nickel oxide thin film may have ionization energy of 5.45 eV to 5.55 eV calculated using ultraviolet photoelectron spectroscopy.

In an embodiment, the first metal cation may be one of a copper cation, a lithium cation, an aluminum cation, and a magnesium cation, and the second metal cation may be one of a copper cation, a lithium cation, an aluminum cation, and a magnesium cation.

In an embodiment, the first metal cation may be a copper monovalent cation, and the second metal cation may be a copper divalent cation.

In an embodiment, the first metal cation may be a cation of an element in Group 1 of the periodic table, and the second metal cation may be a cation of an element in Group 2 of the periodic table.

In an embodiment of the inventive concept, a method for manufacturing a display device includes forming a first electrode layer on a substrate, forming a first common layer on the first electrode layer, forming a light emitting layer on the first common layer, forming a second common layer on the light emitting layer, and forming a second electrode layer on the second common layer, wherein the forming of the first common layer includes mixing a precursor solution of nickel oxide, a precursor solution of a first metal cation, and a precursor solution of a second metal cation, and spin coating the mixed solution followed by a heat treatment to form a nickel oxide thin film co-doped with the first metal cation and the second metal cation, and the oxidation number of the first metal cation and the oxidation number the second metal cation are different from each other.

In an embodiment, the ratio of the combined number of atoms of the first metal cation and the second metal cation in the nickel oxide thin film may be 15% to 25%.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
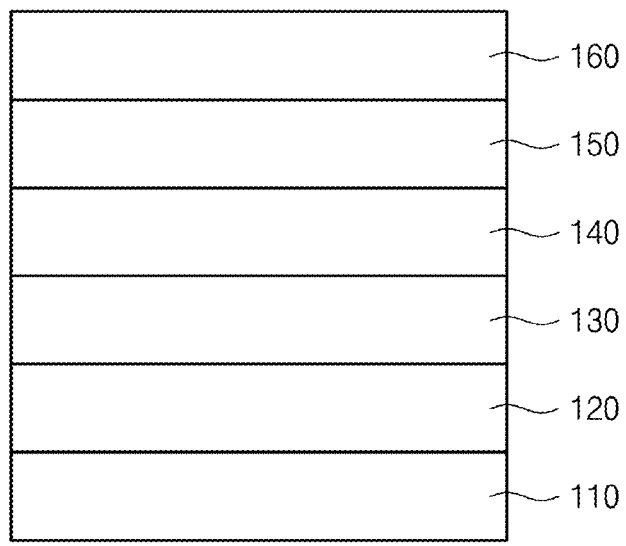
FIG. 1 is a view illustrating a display device according to an embodiment of the inventive concept.

Advantages and features of the inventive concept and methods of accomplishing the same may be understood more readily by reference to the following detailed description of exemplary embodiments and the accompanying drawings. However, the inventive concept will be embodied in many different forms and is not limited to the present embodiments set forth herein. Rather, these embodiments are provided so that this disclosure will be thorough and complete, and will fully convey the scope of the inventive concept to those skilled in the art. The inventive concept will only be defined by the appended claims. The same reference numerals refer to like elements throughout the specification.

The terminology used herein is for the purpose of describing embodiments and is not intended to be limiting of the inventive concept. In the present specification, terms of a singular form may include terms of a plural form unless the context clearly indicates otherwise. As used herein, the terms "comprises" and/or "comprising" are intended to be inclusive of the stated elements, steps, operations and/or devices, and do not exclude the possibility of the presence or the addition of one or more other elements, steps, operations, and/or devices.

Hereinafter, exemplary embodiments of the inventive concept will be described in detail.

FIG. 1 is a view illustrating a display device according to an embodiment of the inventive concept.

Referring to FIG. 1, a display device may include a substrate 110, a first electrode layer 120, a first common layer 130, a light emitting layer 140, a second common layer 150, and a second electrode layer 160.

The substrate 110 may be a glass substrate or a plastic substrate. The substrate 110 may include an insulating film including an organic film or an inorganic film.

On the substrate 110, the first electrode layer 120 may be disposed. The first electrode layer 120 may be a positive electrode. The first electrode layer 120 layer may be made of a material having high conductivity and high work function. The first electrode layer 120 may be a transparent conductive oxide. For example, the first electrode layer 120 may include indium tin oxide, indium zinc oxide, indium gallium zinc oxide, fluorozinc oxide, gallium zinc oxide, tin oxide, or zinc oxide, and the like.

On the first electrode layer 120, the first common layer 130 may be disposed. The first common layer 130 may contribute to the injection and transport of holes between the first electrode layer 120 and the light emitting layer 140.

On the first common layer 130, the light emitting layer 140 may be disposed. The light emitting layer 140 may generate blue light, green light, or white light. The light emitting layer 140 may include a fluorescent light-emitting material or a phosphorescent light-emitting material.

On the light emitting layer 140, the second common layer 150 may be disposed. The second common layer 150 may contribute to the injection and transport of electrons between the second electrode layer 160 and the light emitting layer 140.

On the second common layer 150, the second electrode layer 160 may be disposed. The second electrode layer 160 may be a negative electrode. The second electrode layer 160 may be composed of a material having low work function. For example, the second electrode layer 160 may include lithium, magnesium, aluminum, and the like.

The display device may emit light when an electron injected from the second electrode layer 160 and a hole injected from the first electrode layer 120 are combined in the light emitting layer 140 to form an exciton and the exciton emits energy.

The first common layer 130 may be a thin film including nickel oxide (NiO). The nickel oxide thin film may have excellent optical, electrical, and chemical properties. A pure nickel oxide thin film may have a very low electrical conductivity of about $10^{-4}$ $Scm^{-1}$ to about $10^{-6}$ $cm^{-1}$.

The electrical conductivity of the nickel oxide thin film may increase as the ratio of non-stoichiometric NiOx increases. That is, as the ratio of $Ni^{2+}$ vacancy increases, the electrical conductivity of the nickel oxide thin film may increase.

In order to increase the electrical conductivity of the nickel oxide thin film, either a heat treatment or a plasma treatment may be performed. In addition, a metal cation may be doped into the nickel oxide thin film to increase the electrical conductivity of the nickel oxide thin film. As an example of a metal cation, a copper cation, a lithium cation, an aluminum cation, or a magnesium cation, and the like may be doped. In addition, as another example of a metal cation, a cation of an element in Group 1 of the periodic table and a cation of an element in Group 2 of the periodic table may be doped. Among them, doping the nickel oxide thin film with a copper cation may allow for excellent doping efficiency and applicability of solution processes. In addition, the nickel oxide thin film may be co-doped with two metal cations. The ratio of the combined number of atoms of a first metal cation and a second metal cation may be 15% to 25% of the total number of atoms of the nickel oxide thin film.

The nickel oxide thin film may be doped with a copper divalent cation ($Cu^{2+}$). The doped copper divalent cation may serve as a substitutional element for a nickel divalent cation ($Ni^{2+}$) of the nickel oxide thin film lattice. As the radius of the copper divalent cation ($Cu^{2+}$) is larger than the radius of the nickel divalent cation ($Ni^{2+}$), the ratio of non-stoichiometric nickel oxide in the nickel oxide thin film may increase. Accordingly, the ratio of nickel vacancy in the nickel oxide thin film may increase, and the electrical conductivity of the nickel oxide thin film may increase.

The nickel oxide thin film may be co-doped with a copper monovalent cation ($Cu^{1+}$) and a copper divalent cation ($Cu^{2+}$). The doped copper monovalent cation ($Cu^{1+}$) may combine with oxygen of the nickel oxide thin film to form a first copper oxide ($Cu^2O$). The doped copper divalent cation ($Cu^{2+}$) may combine with oxygen of the nickel oxide thin film to form a second copper oxide (CuO). The first copper oxide may have a lattice structure of a cubic structure and the second copper oxide may have a lattice structure of a monoclinic structure. That is, the copper monovalent cation and the copper divalent cation may be doped into the nickel oxide thin film of to have different lattice structures.

The ratio of the non-stoichiometric nickel oxide may be further increased when the nickel oxide thin film is co-doped with the copper monovalent cation and the copper divalent cation rather than being doped only with the copper divalent cation. Accordingly, the ratio of nickel vacancy of the nickel oxide thin film may further increase, and the electrical conductivity of the nickel oxide thin film may further increase.

The display device according to an embodiment of the inventive concept may be such that the first common layer 130 is a nickel oxide thin film co-doped with the copper monovalent cation and the copper divalent cation. Accordingly, the display device may not be disadvantageous in terms of the transmittance, may be excellent in electrical conductivity, may have high ionization energy, and may have excellent current density and luminance characteristics. Accordingly, the display device may be applied to various photoelectric devices such as displays, solar cells, and electrochromic devices.

Hereinafter, a method for co-doping a nickel oxide thin film with a copper monovalent cation and a copper divalent cation will be described. In the method below, different metal cations may be co-doped instead of the copper monovalent cation and the copper divalent cation. For example, a lithium cation, an aluminum cation, a magnesium cation, and the like may be co-doped. In addition, instead of the copper monovalent cation and the copper divalent cation, a cation of an element in Group 1 of the periodic table and a cation of an element in Group 2 of the periodic table may be co-doped. In addition, only one of the copper monovalent cation and the copper divalent cation may be co-doped. That is, the following method is applicable even when there is no co-doping.

The nickel oxide thin film co-doped with the copper monovalent cation and the copper divalent cation may be formed by a sol-gel process. Specifically, a precursor solution of each material may be synthesized, spin-coated, and then heat-treated to form the nickel oxide thin film.

The precursor solution of nickel oxide may be prepared by dissolving Nickel (II) acetate tetrahydrate ($(CH_3CO_2)_2Ni.4H_2O$) in ethanol at a concentration of 0.1 M, adding ethanolamine ($NH_2CH_2CH_2OH$) thereto as an additive, and stirring for 12 hours at a temperature of 60° C.

The precursor solution of the copper monovalent cation may be prepared by dissolving Copper (I) acetate in ethanol at a concentration of 0.1 M, adding ethanolamine thereto as an additive, and stirring for 10 minutes.

The precursor solution of the copper divalent cation may be prepared by dissolving Copper (II) acetate monohydrate in ethanol at a concentration of 0.1 M, adding ethanolamine thereto as an additive, and stirring for 10 minutes.

The precursor solutions of the nickel oxide, the copper monovalent cation, and the copper divalent cation are mixed at a predetermined ratio, and the mixed solution are spin-coated, and then heat-treated for an hour at a temperature of 500° C. to obtain the nickel oxide thin film co-doped with the copper monovalent cation and the copper divalent cation.

[Table 1] below shows the composition and the like of nickel oxide thin film samples manufactured by the above method. The nickel oxide thin film samples as shown in [Table 1] below may be obtained according to the ratio of the precursor solution of the copper monovalent cation and the copper divalent cation.

TABLE 1

| # | Sample name | Composition | Doping concentration of copper (at %) | Ratio of copper monovalent cation | Ratio of copper divalent cation |
|---|---|---|---|---|---|
| 1 | NiOx | NiOx | 0 | 0 | 0 |
| 2 | CuNiOx (5:5) 5 at % | CuNiOx | 5 | 5 | 5 |
| 3 | CuNiOx (0:10) 5 at % | | 5 | 0 | 10 |
| 4 | CuNiOx (5:5) 20 at % | | 20 | 5 | 5 |
| 5 | CuNiOx (0:10) 20 at % | | 20 | 0 | 10 |

In [Table 1] above, the doping concentration of copper is a ratio of the combined number of atoms of the copper monovalent cation and the copper divalent cation to the total number of atoms of the nickel oxide thin film sample. The ratio of the copper monovalent cation and the ratio of the copper divalent cation is a ratio of the number of atoms of the copper monovalent cation or the copper divalent cation to the number of atoms of the copper cation.

Sample 1 is a nickel oxide thin film composed of pure nickel oxide which has not been doped with the copper monovalent cation and the copper divalent cation.

Sample 2 is a nickel oxide thin film doped with copper at a concentration of 5 at %, wherein the ratio of the copper monovalent cation to the copper divalent cation is 5:5.

Sample 3 is a nickel oxide thin film doped with copper at a concentration of 5 at %, wherein the copper monovalent cation is not doped and only the copper divalent cation is doped.

Sample 4 is a nickel oxide thin film doped with copper at a concentration of 20 at %, wherein the ratio of the copper monovalent cation to the copper divalent cation is 5:5.

Sample 5 is a nickel oxide thin film doped with copper at a concentration of 20 at %, wherein the copper monovalent cation is not doped and only the copper divalent cation is doped.

As such, the composition, the doping concentration of copper, the ratio of the copper monovalent cation and the ratio of the copper divalent cation of each sample may be confirmed according to the sample name thereof.

Samples 1 to 5 may show a reduction in transmittance within 1.8% of the ITO substrate at the wavelength of visible light region (400 to 700 nm). When comparing Samples 2 to 5, as the doping concentration of copper is higher, the transmittance may be lower. However, when the doping concentration of copper is the same, the ratio of the copper monovalent cation and the copper divalent cation and the transmittance may be irrelevant. Accordingly, in terms of transmittance, a nickel oxide thin film co-doped with the copper monovalent cation and the copper divalent cation may not be disadvantageous when compared with a nickel oxide thin film doped only with the copper divalent cation.

Comparing the optical bandgaps of Samples 1 to 5, Sample 1 may have an optical bandgap of 3.62 eV, Samples 2 and 3 may have an optical bandgap of 3.60 eV, and Samples 4 and 5 may have an optical bandgap of 3.57 eV. Accordingly, as the doping concentration of copper is higher, the optical bandgap may be lower. However, when the doping concentration of copper is the same, the ratio of the copper monovalent cation and the copper divalent cation and the optical bandgap may be irrelevant.

Figure 2:
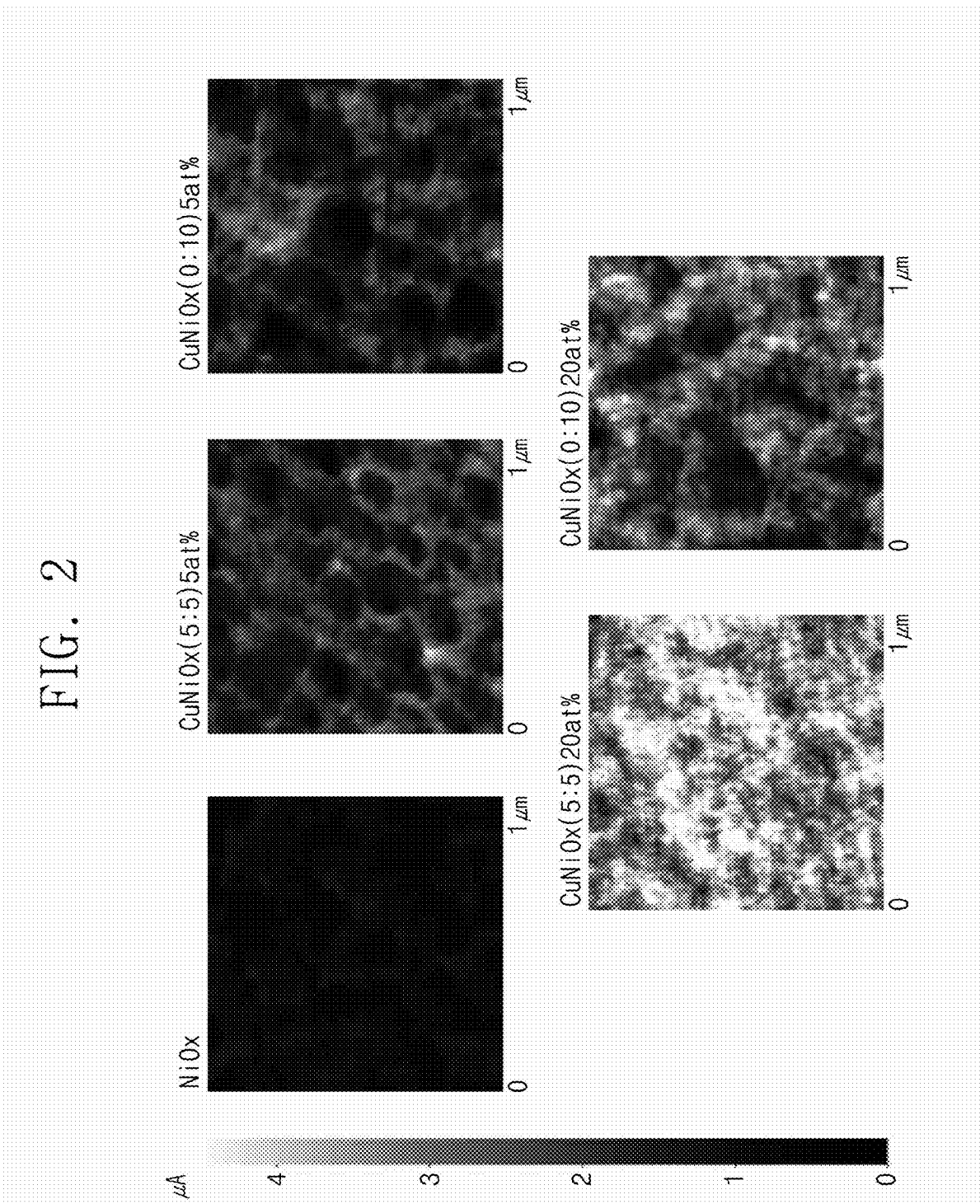
FIG. 2 are C-AFM(conductive atomic force microscopy) images of nickel oxide thin film samples according to an embodiment of the inventive concept.

FIG. 2 are C-AFM(conductive atomic force microscopy) images of nickel oxide thin film samples according to an embodiment of the inventive concept.

Conductive atomic force microscopy is a device for measuring the current flowing through a thin film under a predetermined voltage. The electrical conductivity of the thin film may be measured through C-AFM. As seen in FIG. 2, it can be confirmed that among the C-AFM images of Sample 1 to Sample 5, the C-AFM image of Sample 1 is the darkest, and the C-AFM image of Sample 4 are the brightest. Accordingly, it can be confirmed that the electrical conductivity of Sample 1 is the lowest, and the electrical conductivity of Sample 4 is the highest.

The average vertical current for the image region shown in FIG. 2 may be measured at 0.787 μA for Sample 1, 1.72 μA for Sample 2, 1.53 μA for Sample 3, 3.364 μA for Sample 4, and 2.351 μA for Sample 5. Referring to the above results, as the doping concentration of copper increases, the vertical current flowing through the nickel oxide thin film may increase, and the electrical conductivity may increase as well. In addition, when the doping concentration of copper is the same, in the case in which the cooper monovalent cation and the cooper divalent cation are co-doped, the current flowing through the nickel oxide thin film may increase, and the electrical conductivity may increase as well. Accordingly, it can be confirmed that co-doping increases the electrical conductivity of the nickel oxide thin film more effectively.

Figure 3A:
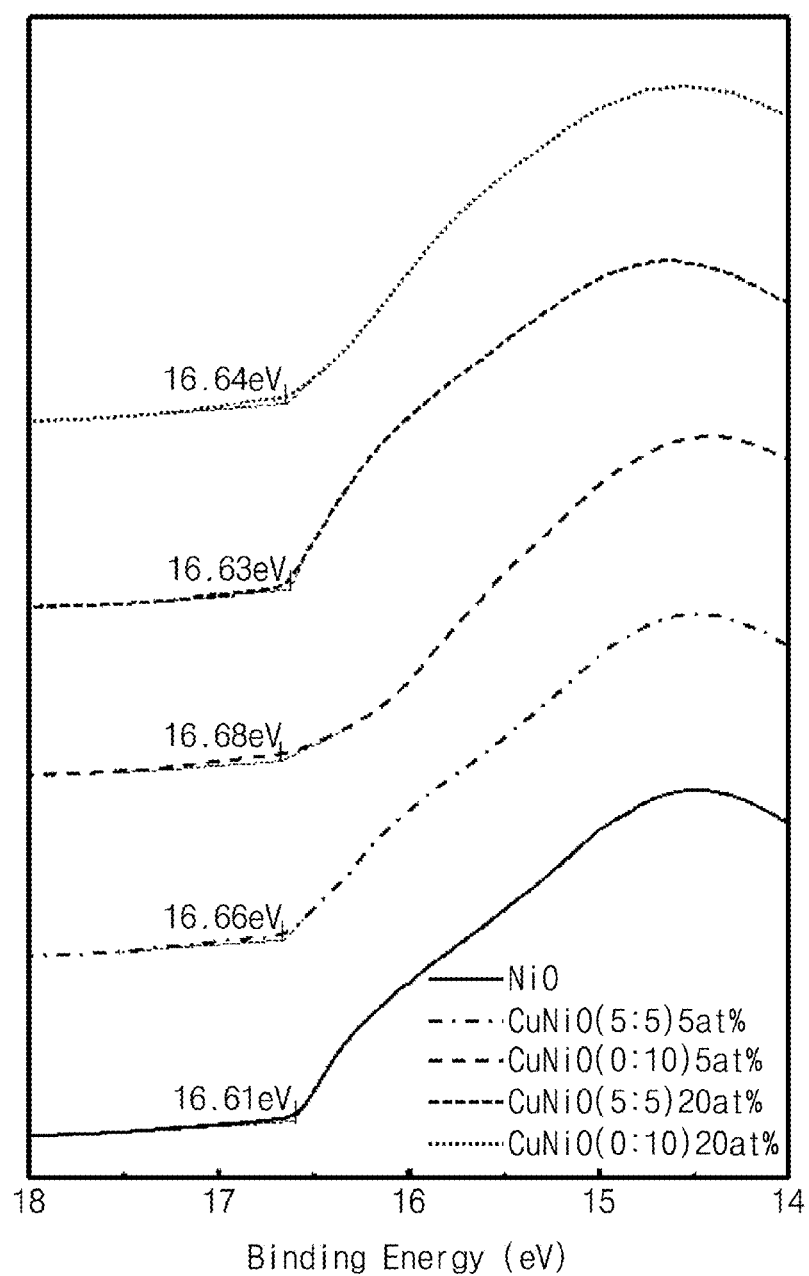
FIG. 3A is a view illustrating the second cut-off spectrum of nickel oxide thin film samples according to an embodiment of the inventive concept.
Figure 3B:
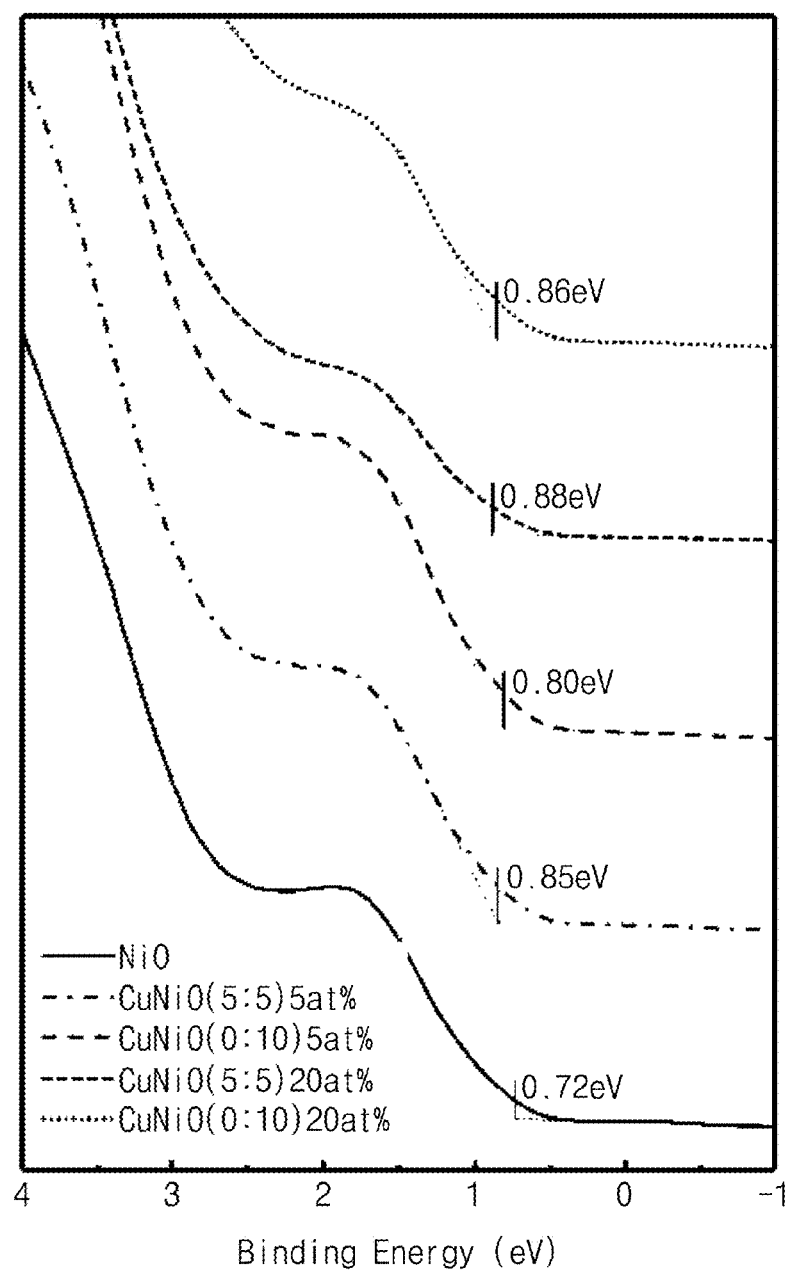
FIG. 3B is a view illustrating the valence band onset spectrum of nickel oxide thin film samples according to an embodiment of the inventive concept.
Figure 3C:
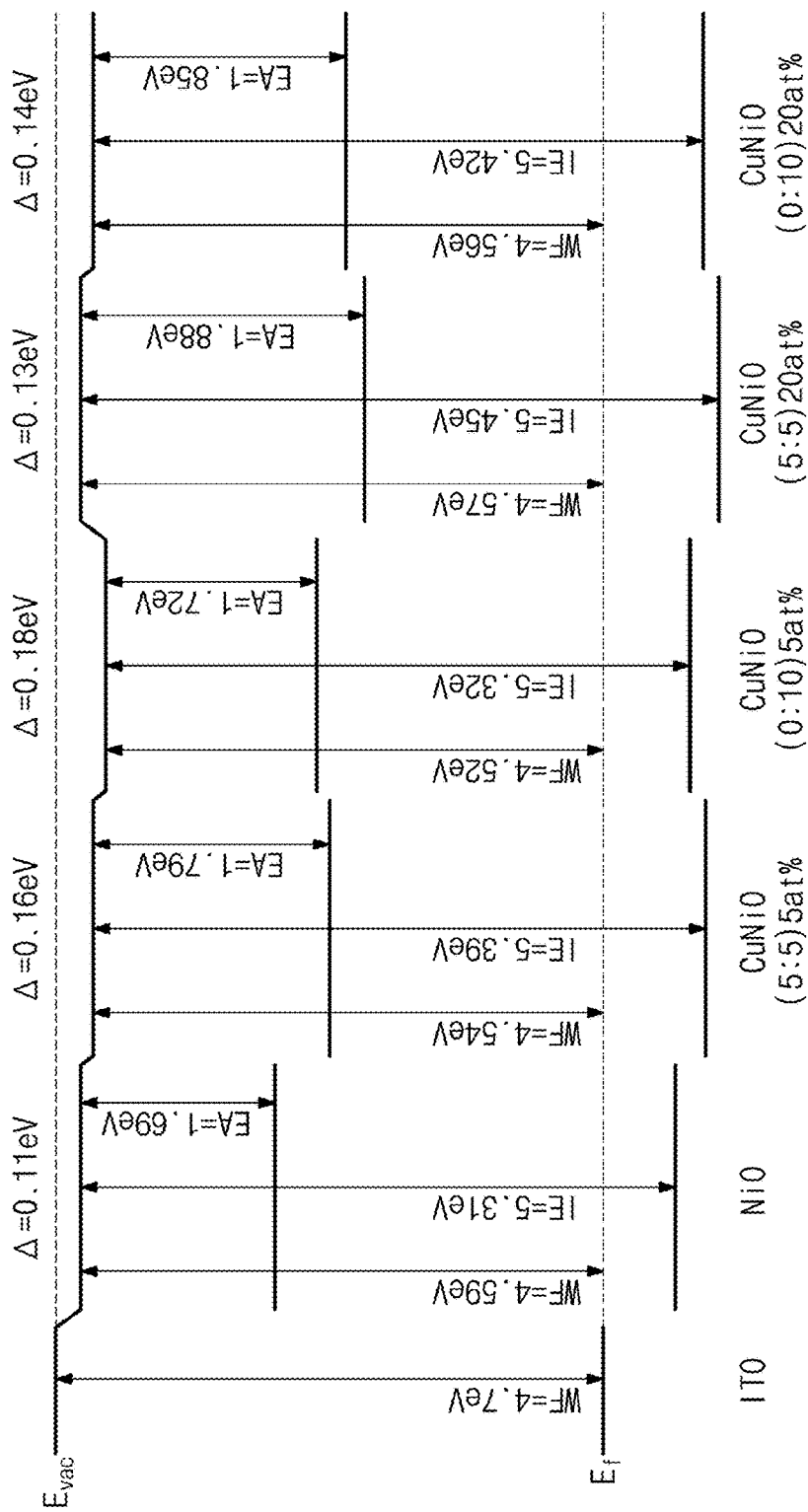
FIG. 3C is a view illustrating the energy level of the nickel oxide thin film samples according to an embodiment of the inventive concept.

FIG. 3A is a view illustrating the second cut-off spectrum of nickel oxide thin film samples according to an embodiment of the inventive concept. FIG. 3B is a view illustrating the valence band onset spectrum of nickel oxide thin film samples according to an embodiment of the inventive concept. FIG. 3C is a view illustrating the energy level of the nickel oxide thin film samples according to an embodiment of the inventive concept.

The nickel oxide thin film according to the inventive concept may be used as a hole injection layer in an optoelectronic device, in which case, the higher the ionization energy (IE) of the nickel oxide thin film, the more advantageous.

Referring to FIG. 3A to FIG. 3C, the second cut-off spectrum and the valence band onset spectrum of nickel oxide thin film samples may be obtained using ultraviolet photoelectron spectroscopy. Accordingly, the ionization energy of nickel oxide thin film samples may be calculated and the calculated ionization energy may be 5.31 eV for Sample 1, 5.39 eV for Sample 2, 5.32 eV for Sample 3, 5.45 eV for Sample 4, and 5.42 eV for Sample 5. Referring to the above results, it can be confirmed that as the doping concentration of copper increases, the ionization energy of the nickel oxide thin film increases. In addition, when the doping concentration of copper is the same, in the case in which the cooper monovalent cation and the cooper divalent cation are co-doped, it can be confirmed that the ionization energy of the nickel oxide thin film increases.

Figure 4:
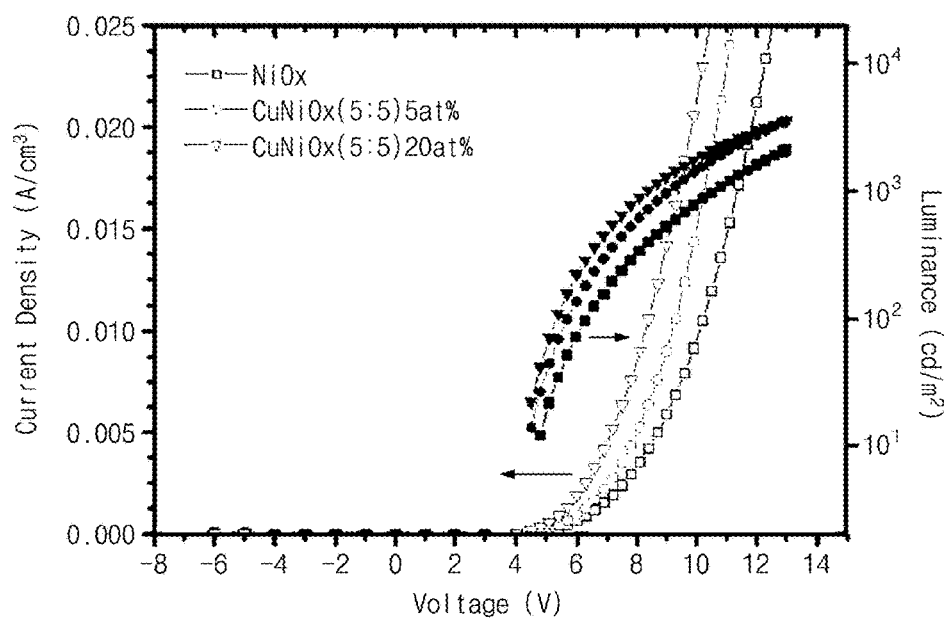
FIG. 4 is a view illustrating the current density and luminance according to voltage of nickel oxide thin film samples according to an embodiment of the inventive concept.
Figure 5A:
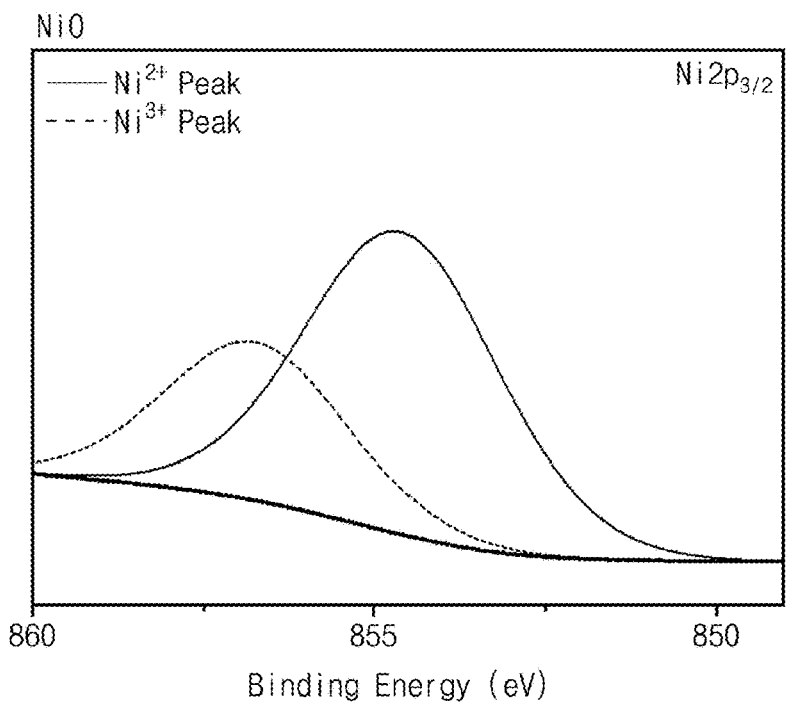
FIG. 5A to 5M are views illustrating the results of narrow scan of Ni2p electron orbits of nickel oxide thin films according to an embodiment of the inventive concept.
Figure 5B:
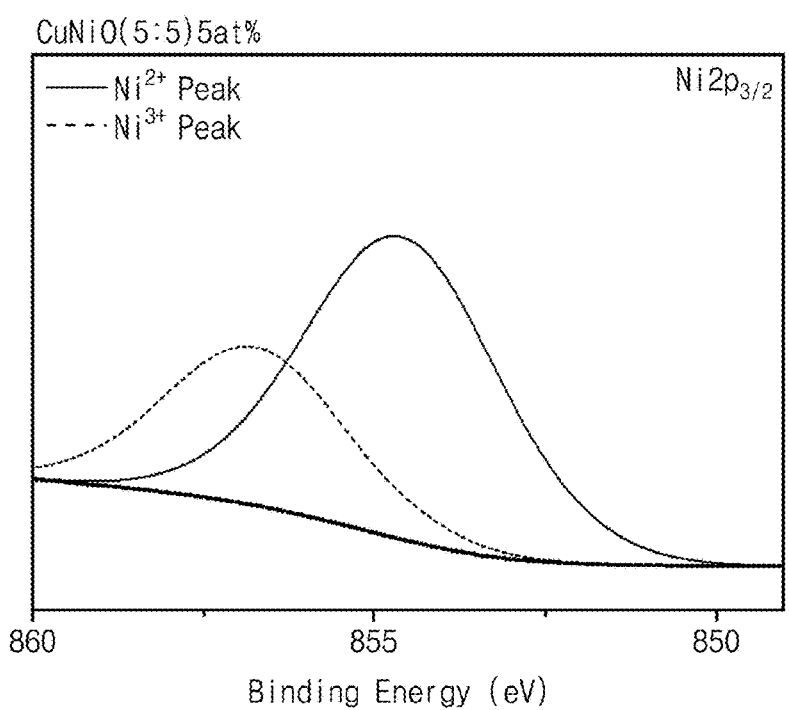
Figure 5C:
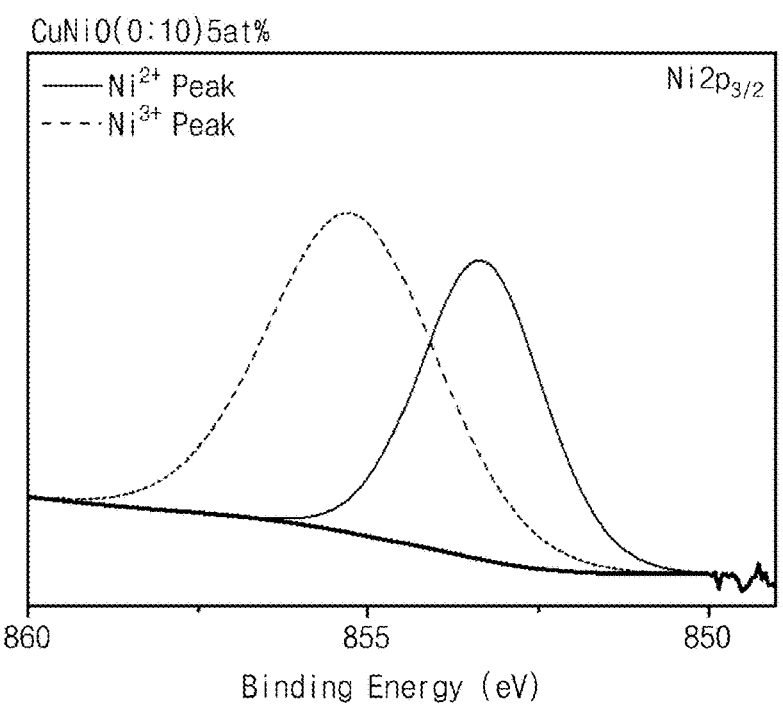
Figure 5D:
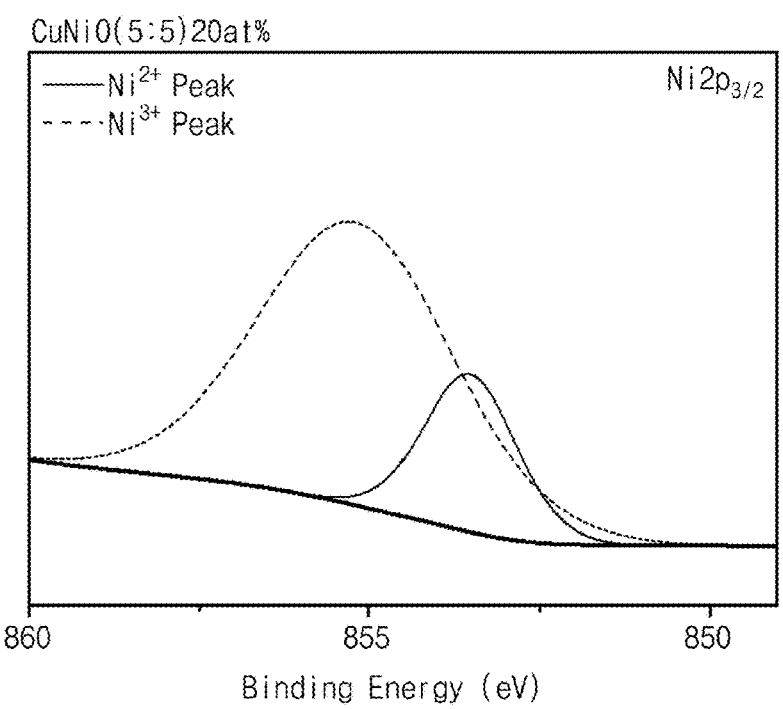
Figure 5E:
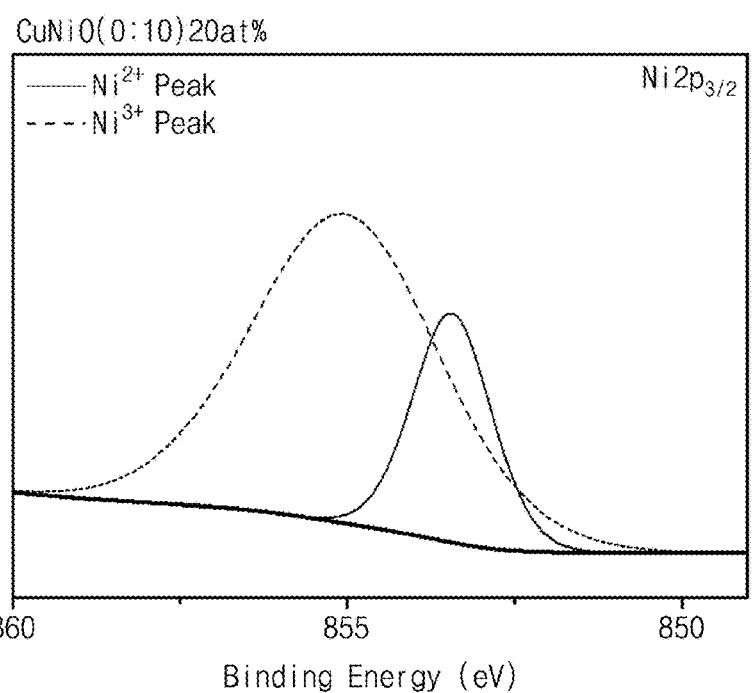
Figure 5F:
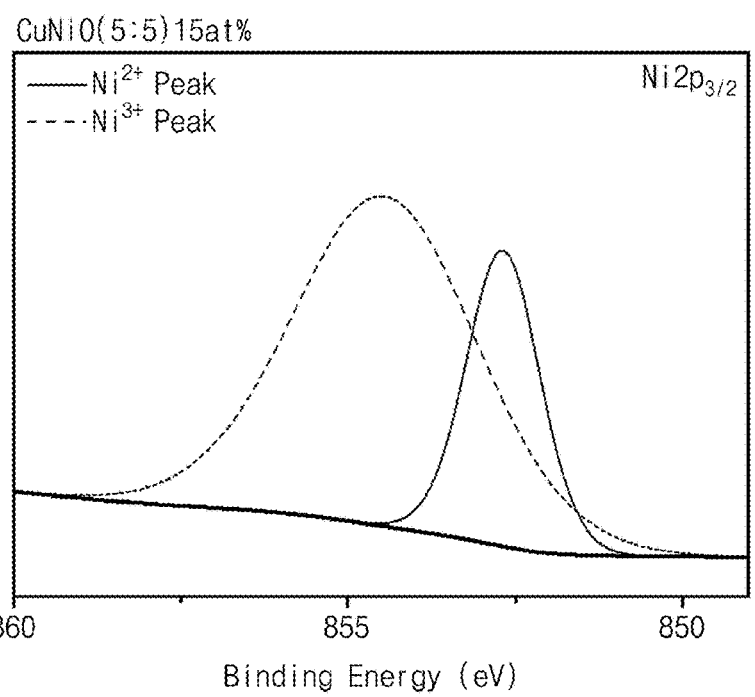
Figure 5G:
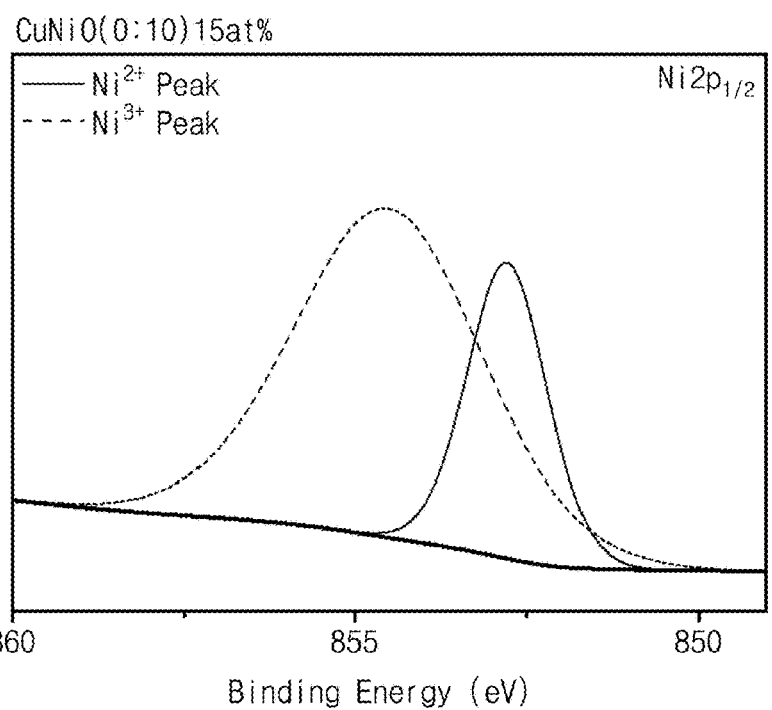
Figure 5H:
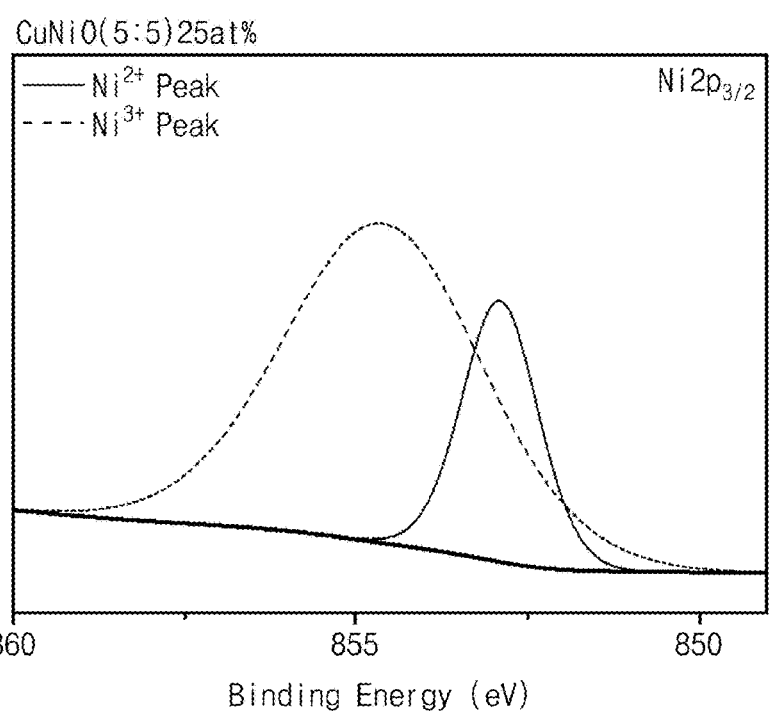
Figure 5I:
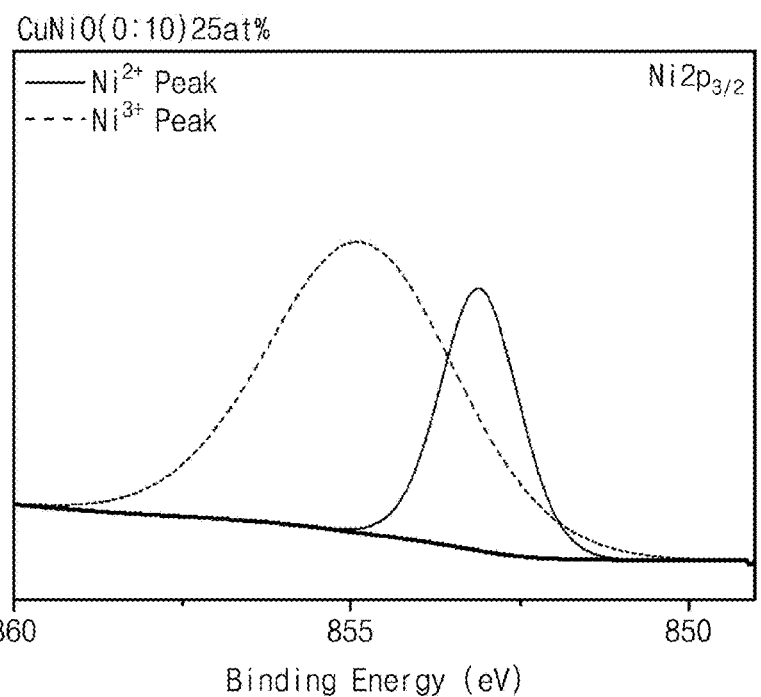
Figure 5J:
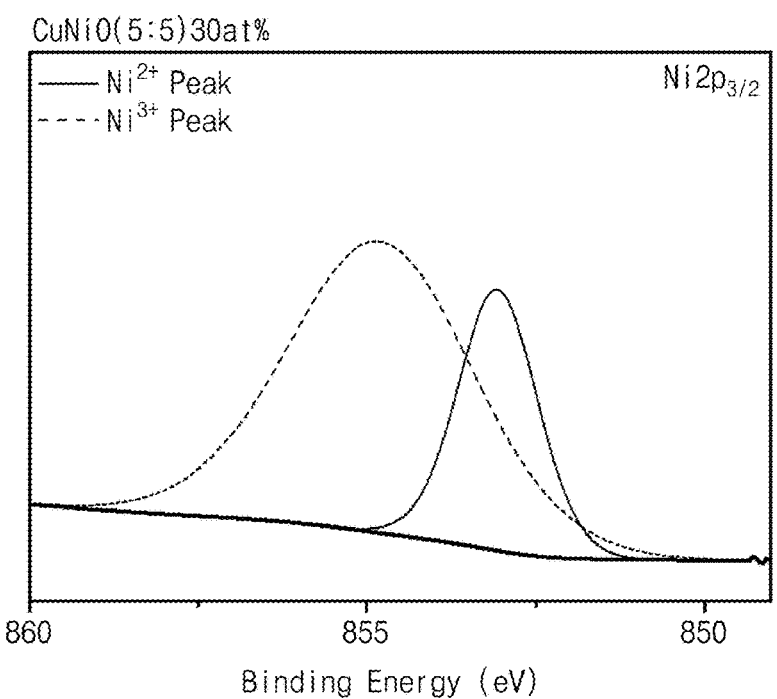
Figure 5K:
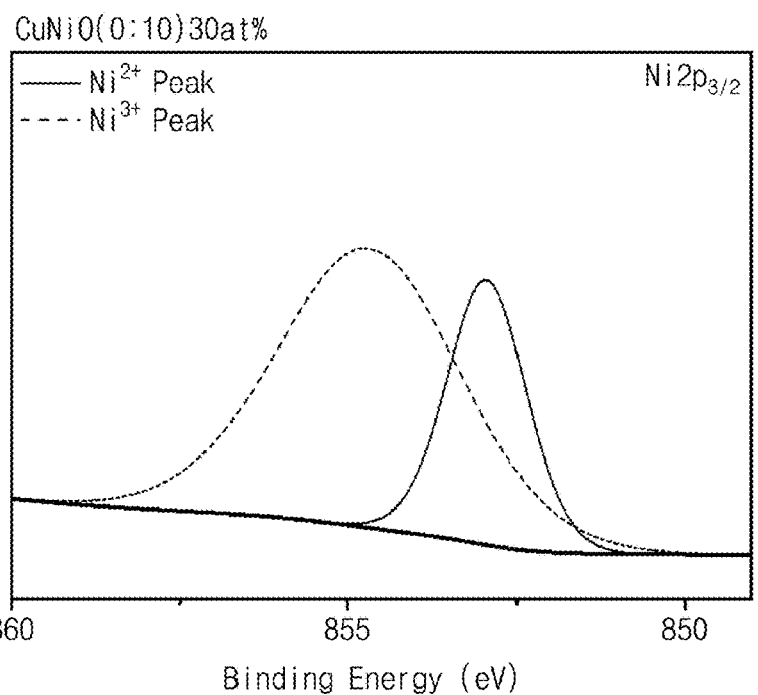
Figure 5L:
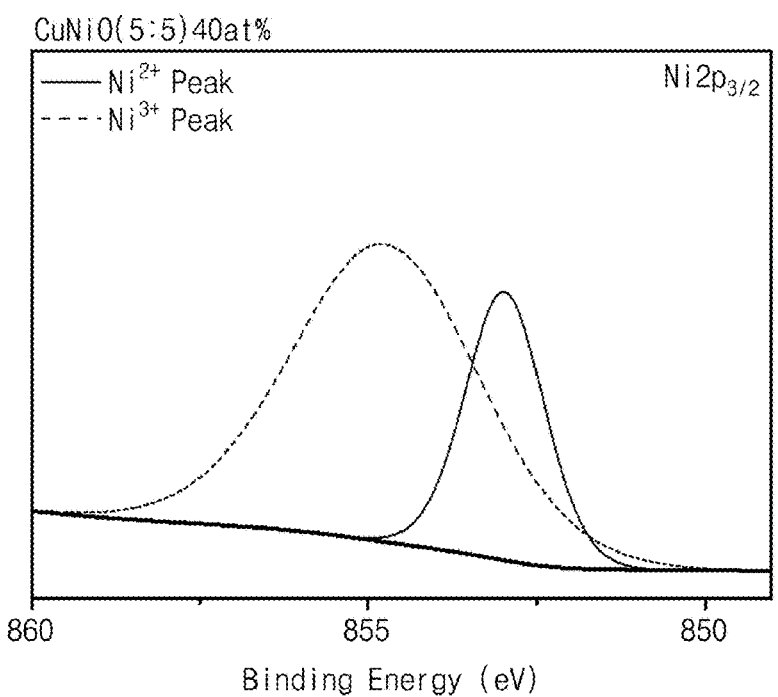
Figure 5M:
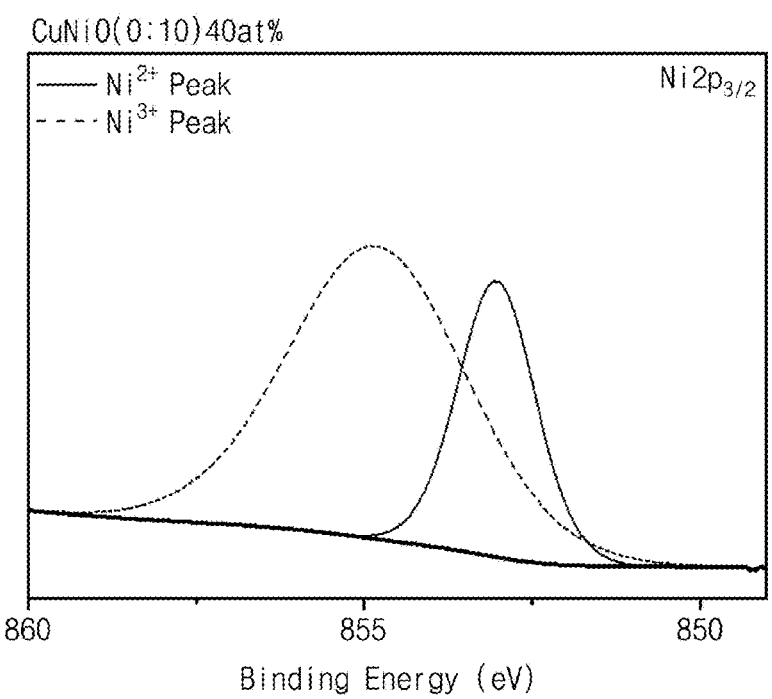

FIG. 4 is a view illustrating the current density and luminance according to voltage of nickel oxide thin film samples according to an embodiment of the inventive concept.

In FIG. 4, the line consisting of hollow figures represents the current density, and the line consisting of the figures inside of which is filled represents the luminance.

Referring to FIG. 4, when comparing Sample 1 and Sample 2, it can be seen that current density and luminance properties become excellent when the nickel oxide thin film is co-doped with the copper monovalent cation and the copper divalent cation. When comparing Sample 2 and Sample 4, it can be confirmed that even in the case in which the copper monovalent cation and the copper divalent cation are doped at the same ratio, as the total copper doping concentration is higher, the current density and luminance properties of the nickel oxide thin film become excellent.

FIG. 5A to FIG. 5M are views illustrating the results of narrow scan of Ni2p electron orbits of nickel oxide thin films according to an embodiment of the inventive concept.

Referring to FIG. 5A to FIG. 5M, in the results of narrow scan of Ni2p electron orbits using X-ray photoelectron spectroscopy, the chemical composition of nickel oxide thin film samples may be confirmed.

The binding energy at the vertex of $Ni^{2+}$ peak and $Ni^{3+}$ peak may be obtained to obtain the binding energy of the $Ni^{2+}$ peak and the $Ni^{2+}$ peak. The $Ni^{2+}$ peak and the $Ni^{2+}$ peak may be subjected to deconvolution to obtain the area of the $Ni^{2+}$ peak and the $Ni^{2+}$ peak. The $Ni^{2+}$ peak represents stoichiometric NiO, and the $Ni^{3+}$ peak represents non-stoichiometric NiOx. Accordingly, using the area of the $Ni^{2+}$ peak and the $Ni^{3+}$ peak, the ratio of stoichiometric nickel oxide and non-stoichiometric nickel oxide may be obtained. Peak ratio refers to the area of $Ni^{3+}$ peak divided by the area of $Ni^{2+}$ peak. As described above, the values shown in Table 2 below may be obtained by analyzing FIG. 5A to FIG. 5M.

[Table 2] below shows the peak ratio and the like of nickel oxide thin film samples.

TABLE 2

| # | Sample name | $Ni^{2+}$ Peak | | $Ni^{3+}$ Peak | | Peak ratio |
|---|---|---|---|---|---|---|
| | | Binding energy (eV) | Area (a.u.) | Binding energy (eV) | Area (a.u.) | |
| 1 | NiOx | 854.61 | 90412.3 | 856.75 | 44726.6 | 0.5 |
| 2 | CuNiOx (5:5) 5 at % | 853.51 | 42930.7 | 855.24 | 108565.6 | 2.53 |
| 3 | CuNiOx (0:10) 5 at % | 853.48 | 42233.6 | 855.17 | 100688.9 | 2.38 |
| 4 | CuNiOx (5:5) 20 at % | 853.52 | 23238 | 855.2 | 87617.7 | 3.77 |
| 5 | CuNiOx (0:10) 20 at % | 853.43 | 36822.3 | 855.03 | 118173.9 | 3.21 |
| 6 | CuNiOx (5:5) 15 at % | 852.69 | 23850.4 | 854.45 | 67103 | 2.81 |
| 7 | CuNiOx (0:10) 15 at % | 852.79 | 24743.7 | 854.52 | 65101.3 | 2.63 |
| 8 | CuNiOx (5:5) 25 at % | 852.9 | 20926.5 | 854.6 | 66521.2 | 3.18 |
| 9 | CuNiOx (0:10) 25 at % | 853.1 | 22091.8 | 854.85 | 59056.5 | 2.67 |
| 10 | CuNiOx (5:5) 30 at % | 853.07 | 21652.4 | 854.8 | 56565.1 | 2.61 |
| 11 | CuNiOx (0:10) 30 at % | 852.95 | 22105.3 | 854.7 | 53656.3 | 2.43 |
| 12 | CuNiOx (5:5) 40 at % | 852.98 | 17965.3 | 854.75 | 47091.5 | 2.62 |
| 13 | CuNiOx (0:10) 40 at % | 853.02 | 19187.5 | 854.82 | 46788.8 | 2.44 |

Sample 6 to Sample 13, as in the case of Sample 2 to Sample 5 described with reference to [Table 1], have the composition, the doping concentration of copper, the ratio of the copper monovalent cation and the ratio of the copper divalent cation of each sample according to the sample name thereof.

For example, Sample 6 is a nickel oxide thin film having a composition of CuNiOx and doped with copper at a concentration of 15 at %, wherein the ratio of copper monovalent cation to copper divalent cation is 5:5.

In addition, Sample 9 is a nickel oxide thin film having a composition of CuNiOx and doped with copper at a concentration of 25 at %, wherein the copper monovalent cation is not doped and only the copper divalent cation is doped.

Referring to [Table 2], when the doping concentration copper is 0 at % to 20 at %, it can be confirmed that as the doping concentration copper increases, the peak ratio increases. In addition, when the doping concentration copper is 20 at % to 30 at %, it can be confirmed that as the doping concentration copper increases, the peak ratio decreases. In addition, when the doping concentration copper is 30 at % to 40 at %, it can be confirmed that the change in the doping concentration copper does not greatly affect the peak ratio.

When the doping concentration copper is the same, it can be confirmed that the peak ratio is higher in the case in which the copper monovalent cation and the copper divalent cation are co-doped at a ratio of 5:5 than in the case in which only the copper divalent cation is doped.

Taken all the above results together, it can be confirmed that the peak ratio of Sample 4 is the largest among all the samples, and accordingly, the ratio of non-stoichiometric nickel oxide thereof is the highest. Accordingly, the nickel vacancy of the nickel oxide thin film in Sample 4 among all the samples may be the most, and the electrical conductivity of Sample 4 may be the highest.

The present disclosure provides a display device having a nickel oxide thin film co-doped with a copper monovalent cation and a copper divalent cation, thereby having excellent electrical conductivity, high ionization energy, and excellent current density and luminance characteristics, and a manufacturing method thereof.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A display device comprising:
    a substrate;
    a first electrode layer disposed on the substrate;
    a first common layer disposed on the substrate;
    a light emitting layer disposed on the first common layer;
    a second common layer disposed on the light emitting layer; and
    a second electrode layer disposed on the second common layer,
    wherein the first common layer comprises a nickel oxide thin film co-doped with a first metal cation and a second metal cation, and
    the oxidation number of the first metal cation and the oxidation number of the second metal cation are different from each other.

2. The display device of claim 1, wherein
    the nickel oxide thin film has a peak ratio of 3.5 to 4.0 from the result of narrow scan of Ni2p electron orbit using X-ray photoelectron spectroscopy.

3. The display device of claim 1, wherein
    the nickel oxide thin film has ionization energy of 5.45 eV to 5.55 eV calculated using ultraviolet photoelectron spectroscopy.

4. The display device of claim 1, wherein
    the first metal cation is one of a copper cation, a lithium cation, an aluminum cation, and a magnesium cation, and
    the second metal cation is one of a copper cation, a lithium cation, an aluminum cation, and a magnesium cation.

5. The display device of claim 1, wherein
    the first metal cation is a copper monovalent cation, and the second metal cation is a copper divalent cation.

6. The display device of claim 1, wherein
    the first metal cation is a cation of an element in Group 1 of the periodic table, and
    the second metal cation is a cation of an element in Group 2 of the periodic table.

7. A method for manufacturing a display device, comprising:
    forming a first electrode layer on a substrate;
    forming a first common layer on the first electrode layer;
    forming a light emitting layer on the first common layer;
    forming a second common layer on the light emitting layer; and
    forming a second electrode layer on the second common layer,
    wherein the forming of the first common layer comprises:
    mixing a precursor solution of nickel oxide, a precursor solution of a first metal cation, and a precursor solution of a second metal cation; and
    spin coating the mixed solution followed by a heat treatment to form a nickel oxide thin film co-doped with the first metal cation and the second metal cation,
    wherein the oxidation number of the first metal cation and the oxidation number the second metal cation are different from each other.

8. The method of claim 7, wherein the ratio of the combined number of atoms of the first metal cation and the second metal cation in the nickel oxide thin film is 15% to 25%.

9. The method of claim 7, wherein
    the first metal cation is one of a copper cation, a lithium cation, an aluminum cation, and a magnesium cation, and
    the second metal cation is one of a copper cation, a lithium cation, an aluminum cation, and a magnesium cation.

10. The method of claim 7, wherein
    the first metal cation is a copper monovalent cation, and the second metal cation is a copper divalent cation.

11. The method of claim 7, wherein
    the first metal cation is a cation of an element in Group 1 of the periodic table, and
    the second metal cation is a cation of an element in Group 2 of the periodic table.

* * * * *